(12) United States Patent
Henry et al.

(10) Patent No.: US 6,741,666 B1
(45) Date of Patent: May 25, 2004

(54) DEVICE AND METHOD FOR TRANSFORMING A DIGITAL SIGNAL

(75) Inventors: Félix Henry, Rennes (FR); Bertrand Berthelot, Rennes (FR); Eric Majani, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/480,858

(22) Filed: Jan. 11, 2000

(30) Foreign Application Priority Data

Feb. 24, 1999 (FR) ............................................ 99 02306

(51) Int. Cl.$^7$ ................................................ H04B 1/10
(52) U.S. Cl. ...................... 375/350; 375/240; 348/615; 348/616; 348/617; 348/607; 348/603; 703/2; 703/5; 704/204; 704/503; 704/269; 704/268; 704/229; 704/230; 704/240; 704/255
(58) Field of Search ................................. 375/350, 240; 348/615, 616, 617, 607, 603; 703/2, 5; 704/204, 503, 269, 268, 229, 230, 240, 255

(56) References Cited

U.S. PATENT DOCUMENTS 4,754,492 A * 6/1988 Malvar ........................ 382/268

OTHER PUBLICATIONS

Monet et al. ("Block Adaptive Quantization of Images", IEEE Transactions on Communications, vol. 41, No. 2, Feb. 1993).*

* cited by examiner

Primary Examiner—Stephen Chin
Assistant Examiner—Guillermo Muñoz
(74) Attorney, Agent, or Firm—Fitzpatrick, Cella, Harper & Scinto

(57) ABSTRACT

A method and a device by which original digital signals are analysis-filtered, where the original digital signals include original samples representing physical quantities, and where the original samples are transformed by successive calculation steps into high and low frequency output samples. Any sample calculated at a given step is calculated by a predetermined function of the original samples and/or previously calculated samples, where the samples are ordered by increasing rank. The signal is processed by successive input blocks of samples, where the calculations made on an input block under consideration take into account only the original or calculated samples belonging to the input block under consideration, and where the input block under consideration and the following input block overlap over a predetermined number of original samples. Output blocks are formed, where each output block corresponds respectively to an input block.

18 Claims, 10 Drawing Sheets

DEVICE AND METHOD FOR TRANSFORMING A DIGITAL SIGNAL

Figure 1:
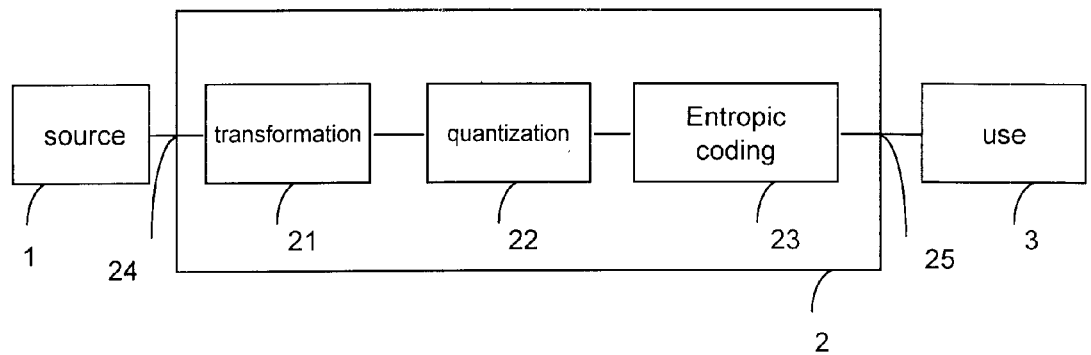

The present invention concerns the filtering of a digital signal, such as the transformation of a digital signal into frequency sub-band signals.

Many digital filtering methods and devices are known. By way of example, digital signal analysis filterings and corresponding synthesis filterings are envisaged here.

These filterings are generally subsystems integrated into the coding and/or decoding systems. They often require a large amount of random access memory or buffer memory space, for storing the data in the course of processing.

However, in practice, the size of the memory means are often less than the size which would be necessary for storing an entire set of data, for example a digital image. It is therefore necessary to "divide" the signal into blocks and to process the blocks one after the other.

However, between an analysis and the corresponding synthesis of a signal, other processings, such as quantization or entropic coding, are generally applied to said signal. These processings, combined with the processings by blocks, cause degradation in the reconstructed signal.

The present invention provides a method and device for transforming a digital signal which processes the signals by blocks, whilst limiting the degradation in the reconstructed signal.

To this end, the invention proposes a method for the analysis filtering of an original digital signal including original samples representing physical quantities, original samples of the digital signal being transformed by successive calculation steps into high and low frequency output samples, any sample calculated at a given step being calculated by a predetermined function of original samples, and/or previously calculated samples, the samples being ordered by increasing rank, characterised in that:
  the signal is processed by successive input blocks of samples, calculations made on an input block under consideration taking into account only the original or calculated samples belonging to the input block under consideration,
  the input block under consideration and the following input block overlap over a predetermined number of original samples,
  output blocks are formed, each output block corresponding respectively to an input block,
  two consecutive output blocks overlap over output samples having the same ranks as the original samples on which the input blocks corresponding to the output blocks under consideration overlap.

By virtue of the invention, the data are coded and then decoded by blocks, whilst limiting the discontinuities at the block limits. In addition, any block is coded and decoded independently of other blocks.

Moreover, the inventors have found that the buffer memory occupation by the data in the course of processing is optimised. Thus complex filterings can be integrated into a large number of apparatuses, without these requiring very large memories.

According to a preferred embodiment, the blocks are formed in the following manner:
  the start limit of the input block under consideration is formed between a first original sample and a first output sample, passing successively, from a previous sample to a following sample calculated as a function of the previous sample, the following sample having a rank equal to or greater than the previous sample,
  the end limit of the input block under consideration is formed between a second original sample and a second output sample, passing successively from a previous sample to a following sample, calculated as a function of the previous sample, the following sample having a rank equal to or less than the previous sample,
  the end limit of the input block under consideration and the start limit of the following input block are such that there does not exist any compatibility sample having a rank strictly less than the rank of the sample belonging to the start limit of the following input block and to the same row as the compatibility sample, and at the same time a rank strictly greater than the rank of the sample belonging to the end limit of the input block under consideration and to the same row as the compatibility sample.

According to a preferred characteristic, two consecutive output blocks overlap over a single output sample. Thus the memory occupation of the data in the course of processing is minimised.

Preferably, two consecutive output blocks overlap over a single output sample, which is a low-frequency output sample. Thus the discontinuities on reconstruction are limited.

The invention also concerns a method of coding a digital signal including original samples representing physical quantities, the coding including:
  an analysis filtering effected according to the above method, in order to form filtered samples,
  a quantization of the previously filtered samples, and
  an entropic coding of the previously quantized samples.

The coding method has advantages similar to these of the filtering method.

According to a preferred characteristic of the coding method, the same quantization, with the same parameters, is used for two successive blocks, at least for the samples situated in the overlap part of the two blocks under consideration. Thus the samples present in two blocks are coded and decoded at the same value.

Preferably, the quantization is a scalar quantization and the same scalar quantization, with the same quantization step, is used for two successive blocks, at least for the samples situated in the overlap part of the two blocks under consideration.

The discontinuity effect at the limits of the blocks is reduced to the maximum possible extent.

According to preferred characteristics, the digital signal is an image signal and the original samples are rows or columns of the image. The invention advantageously applies to an image signal, which generally requires a large amount of memory space. This memory space is reduced by virtue of the invention.

Correlatively, the invention proposes analysis filtering and coding devices, which have means adapted to implement the above characteristics.

The invention also concerns a digital apparatus including the above transformation device or means of implementing the transformation method. The advantages of the device and of the digital apparatus are identical to those previously disclosed.

An information storage means, which can be read by a computer or by a microprocessor, integrated or not into the device, possibly removable, stores a program implementing the filtering method.

Figure 2:
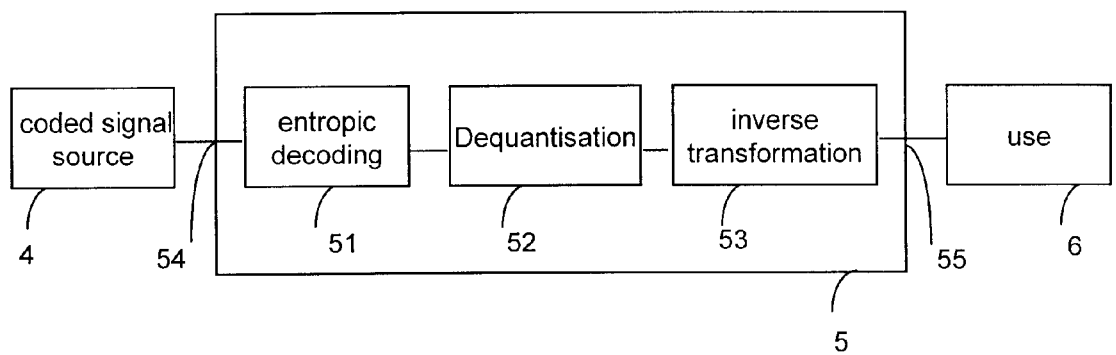
Figure 3:
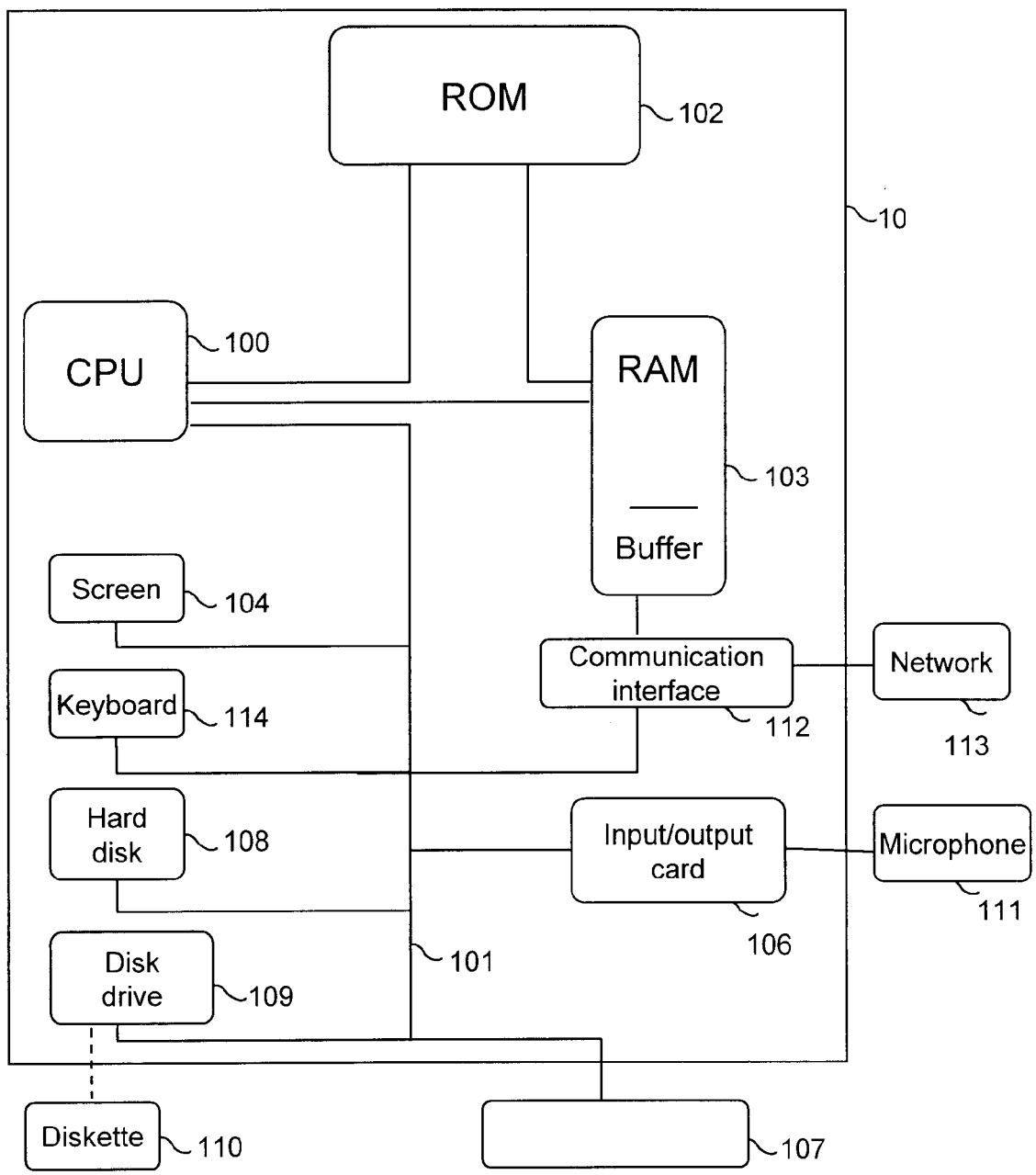
Figure 4:
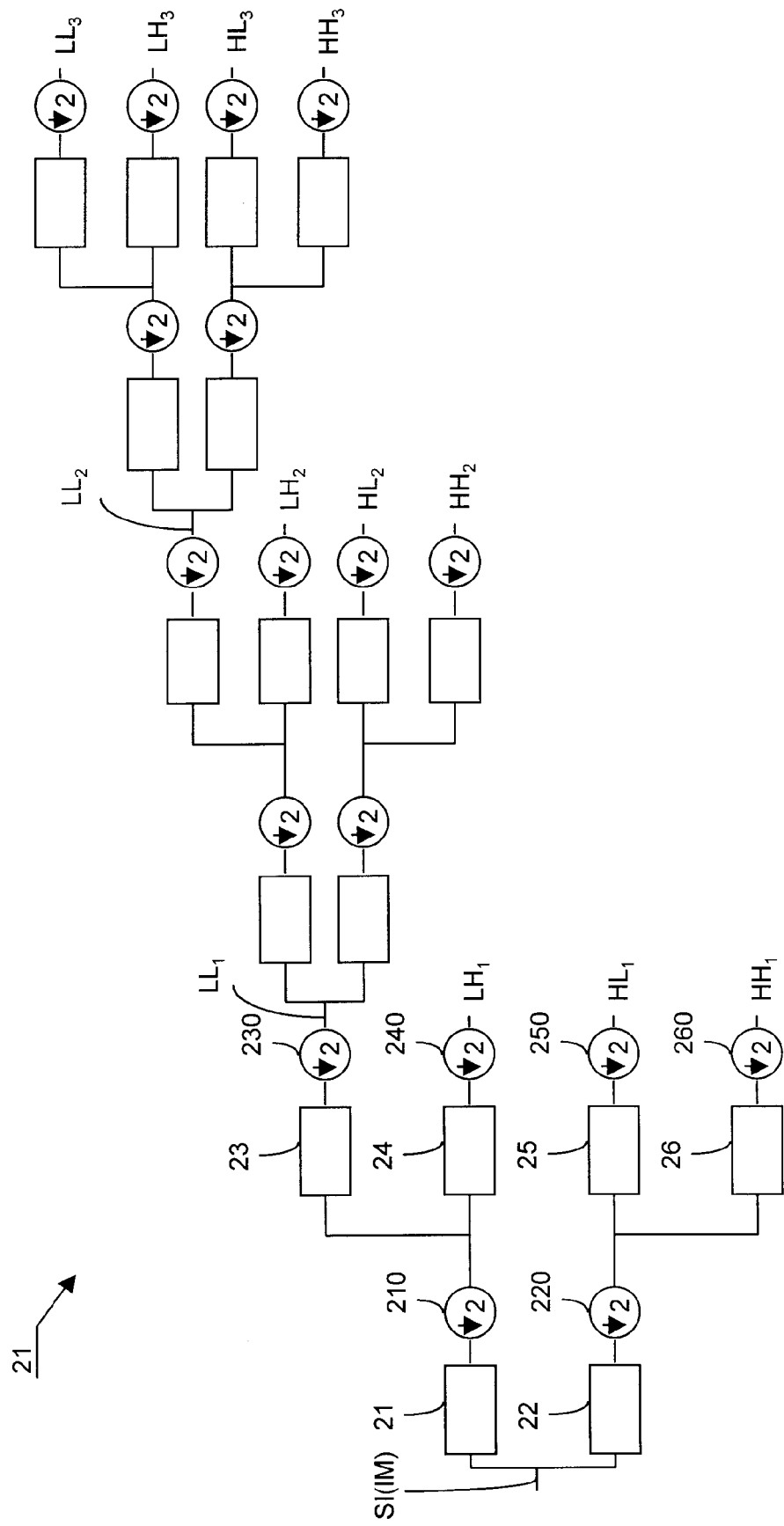
Figure 6:
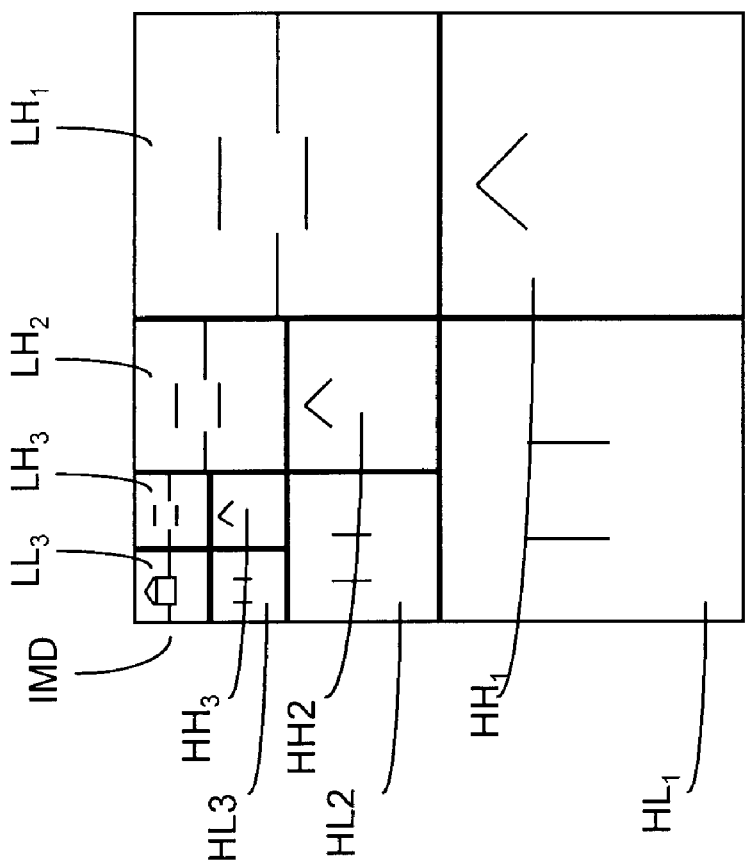
Figure 5:
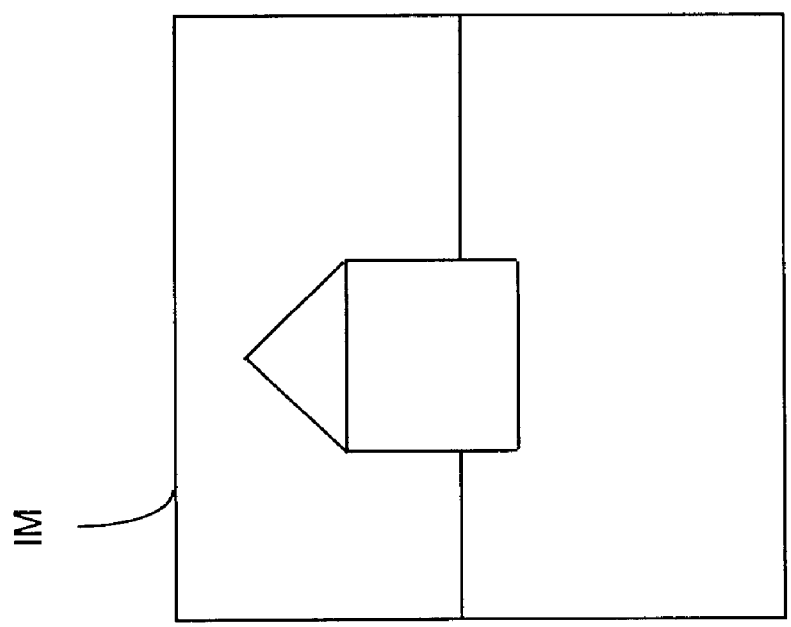
Figure 7:
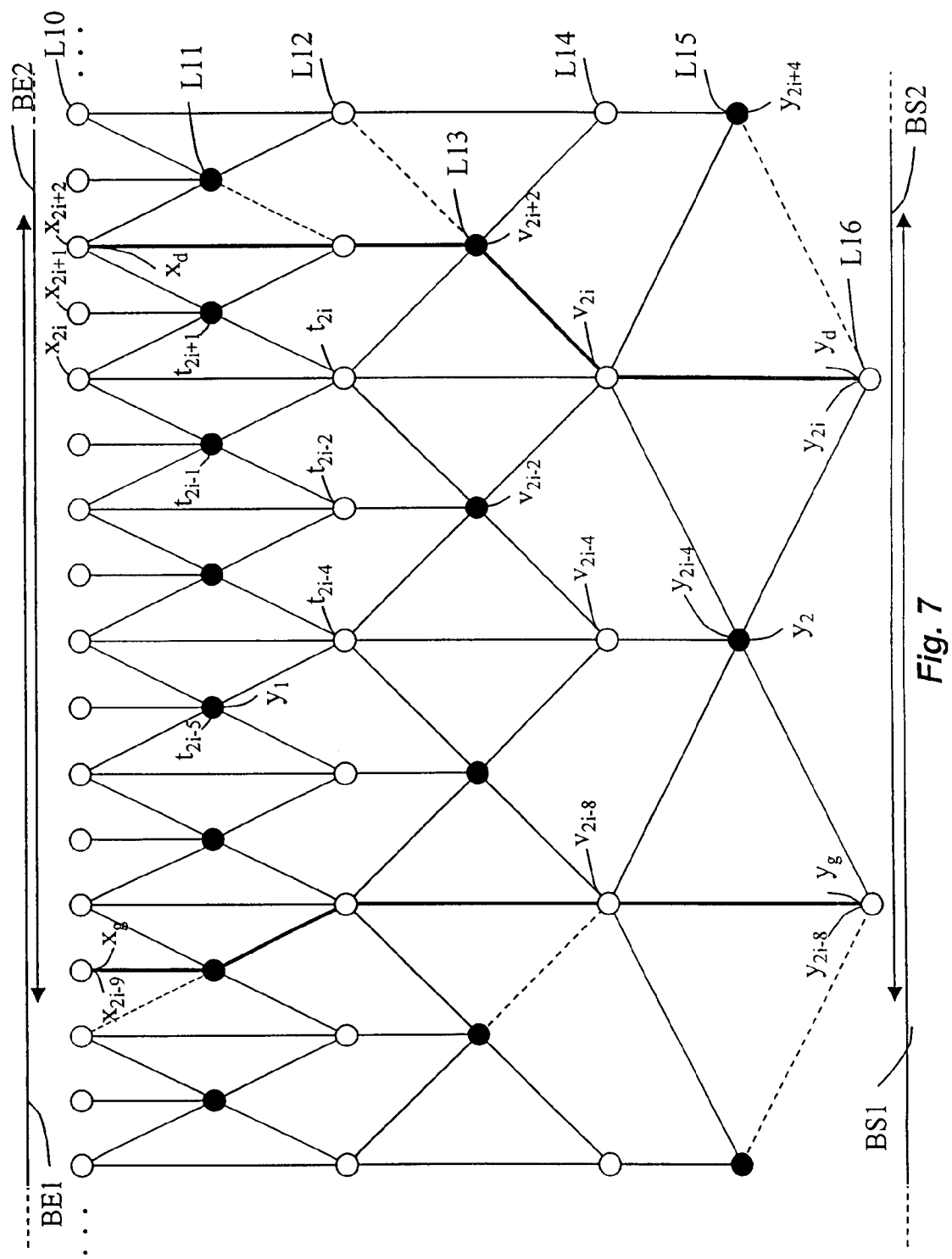
Figure 8:
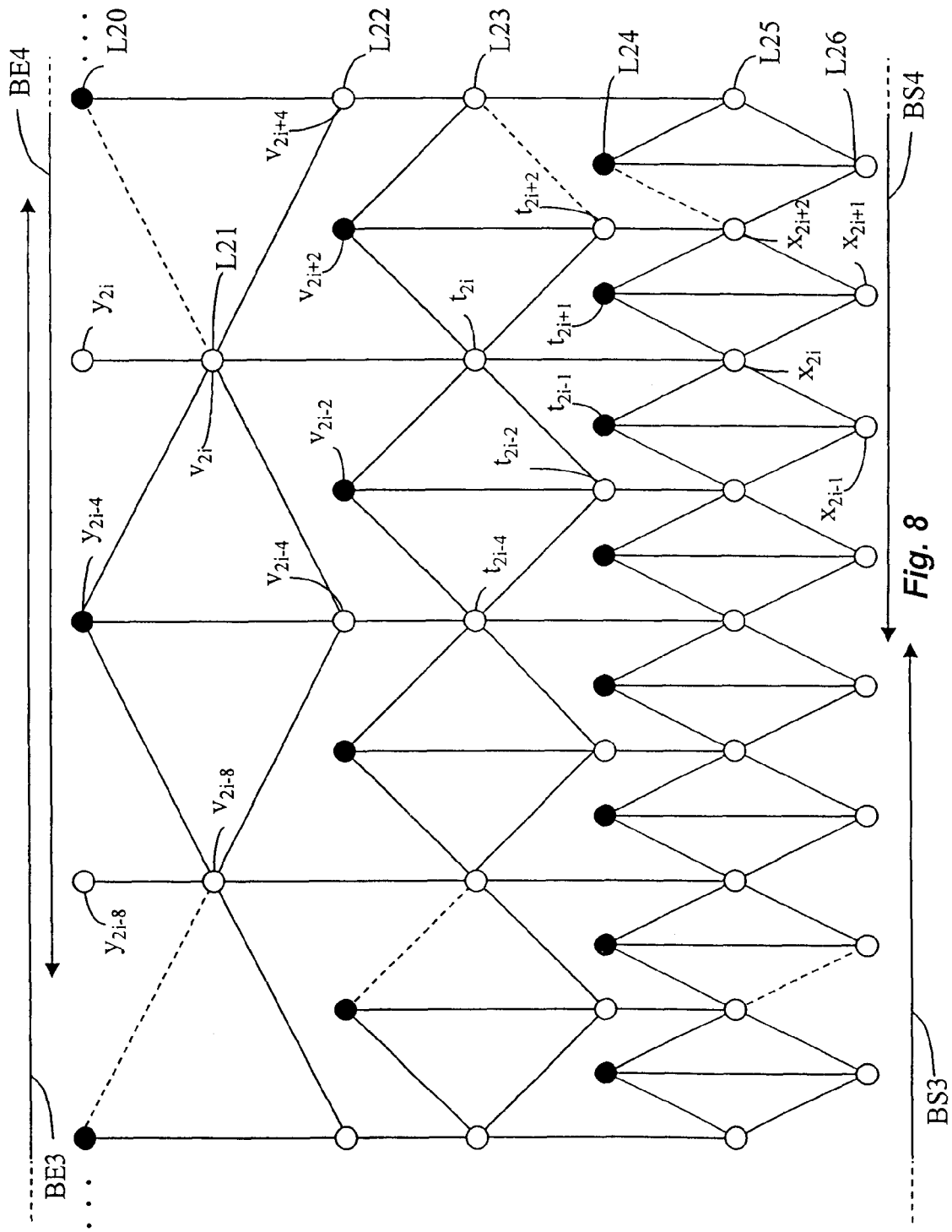
Figure 9:
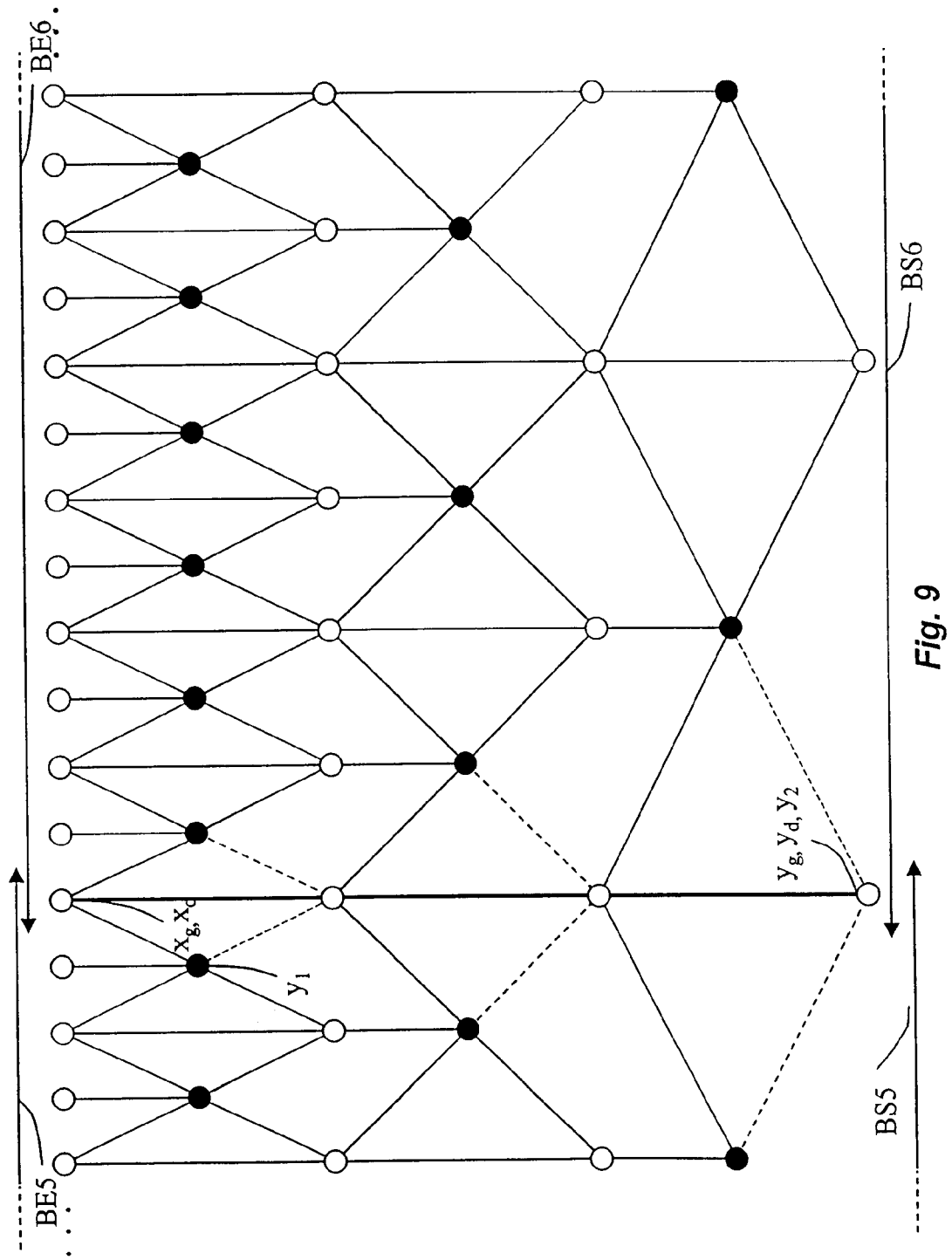
Figure 10:
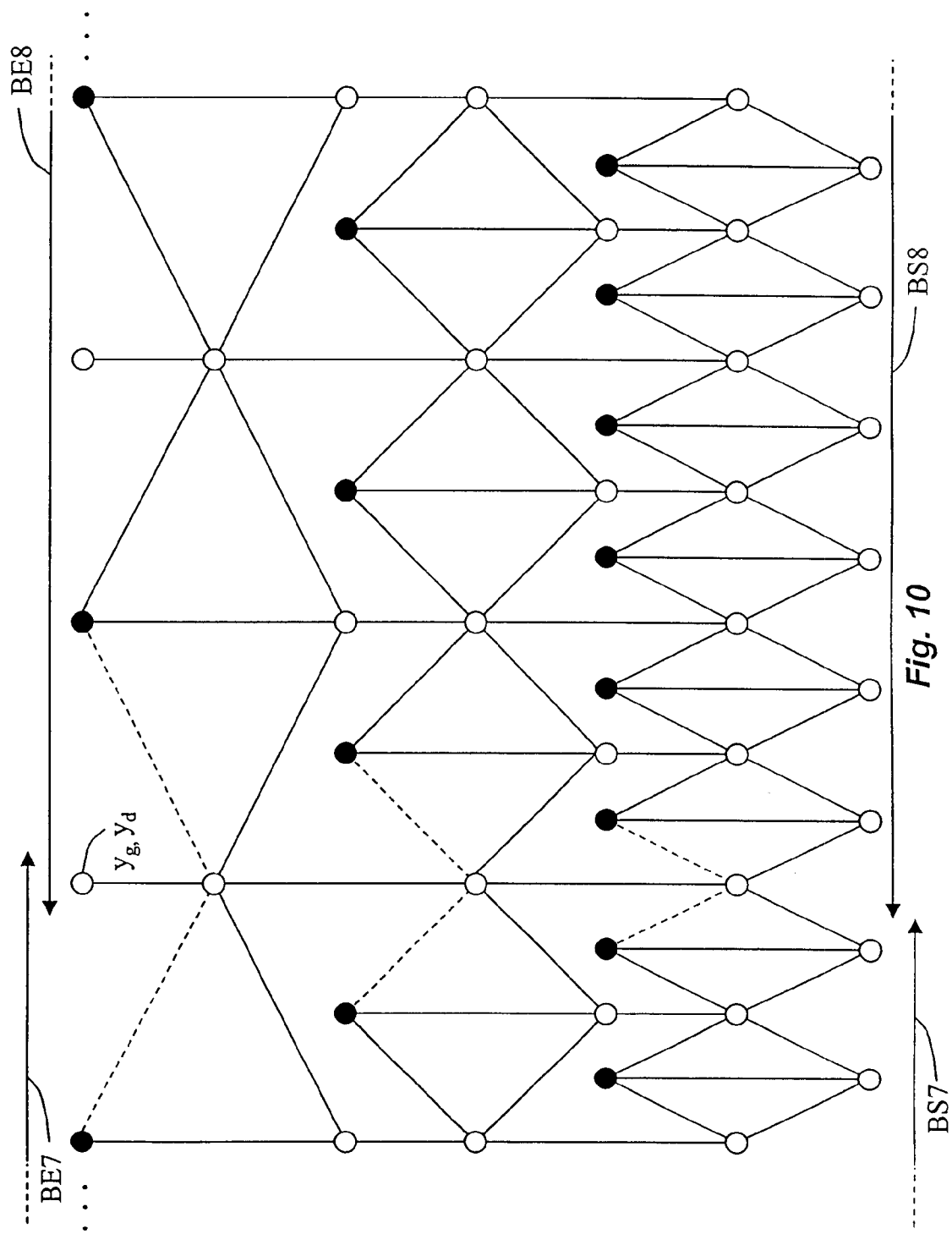
Figure 11:
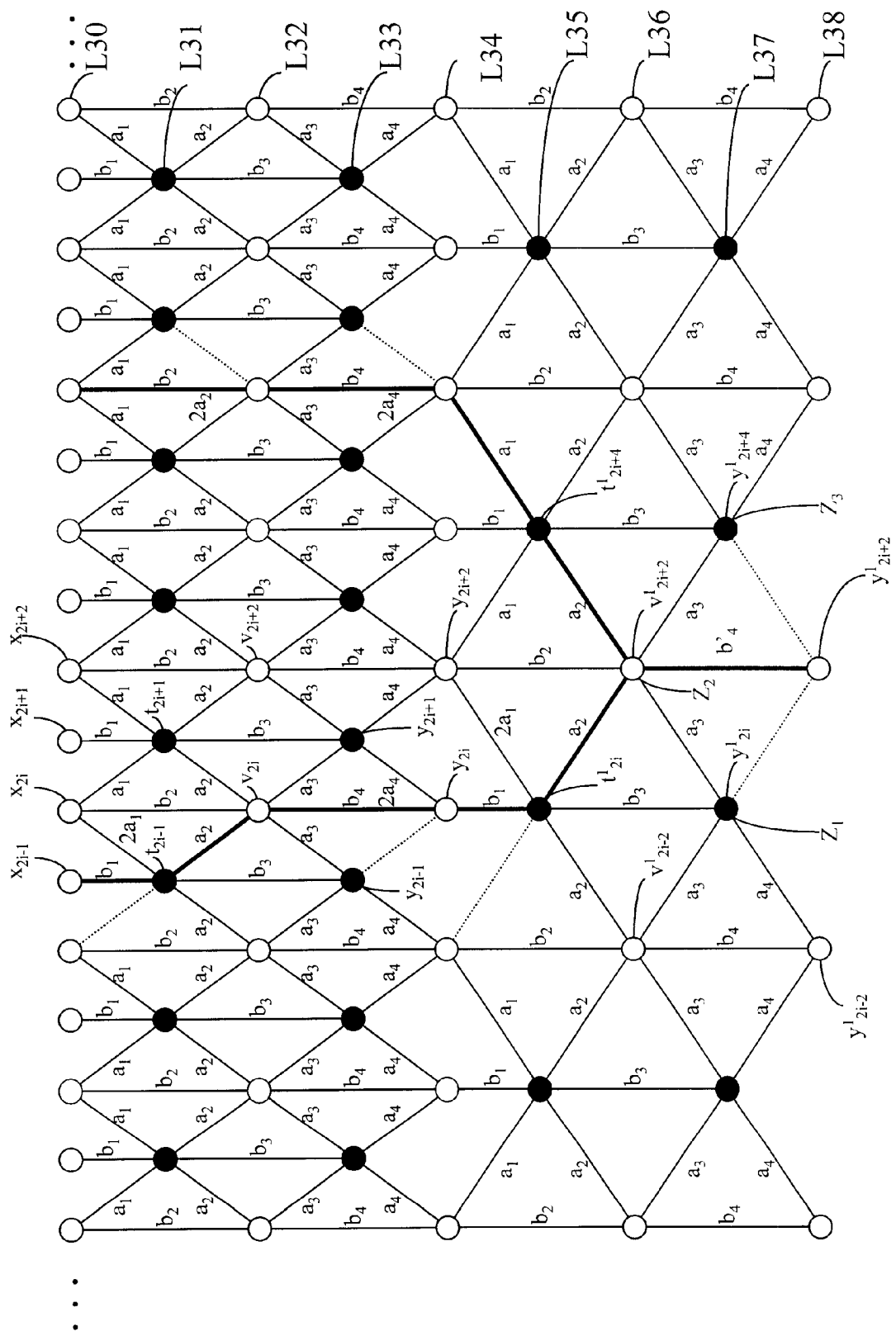
Figure 12:
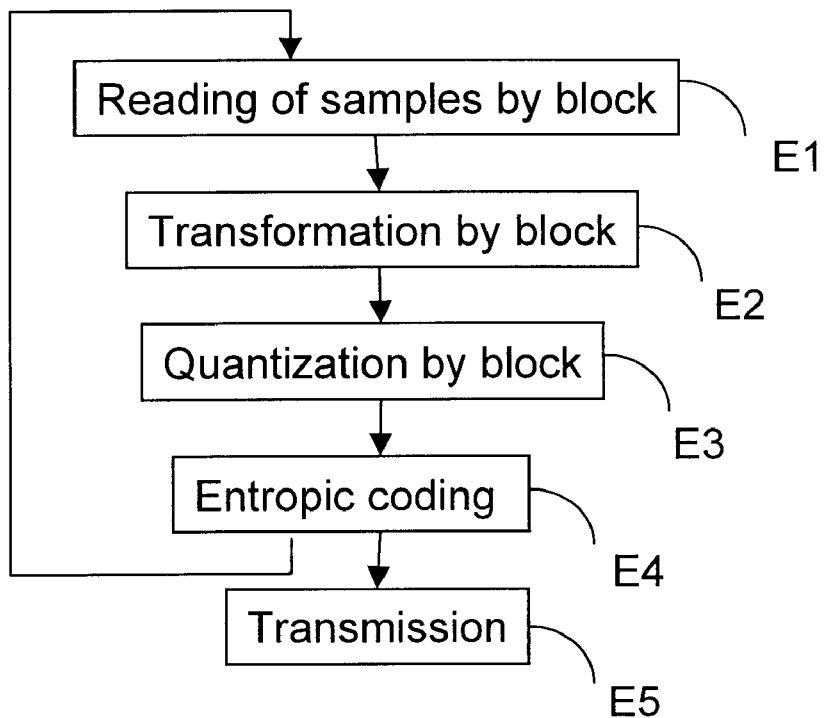
Figure 13:
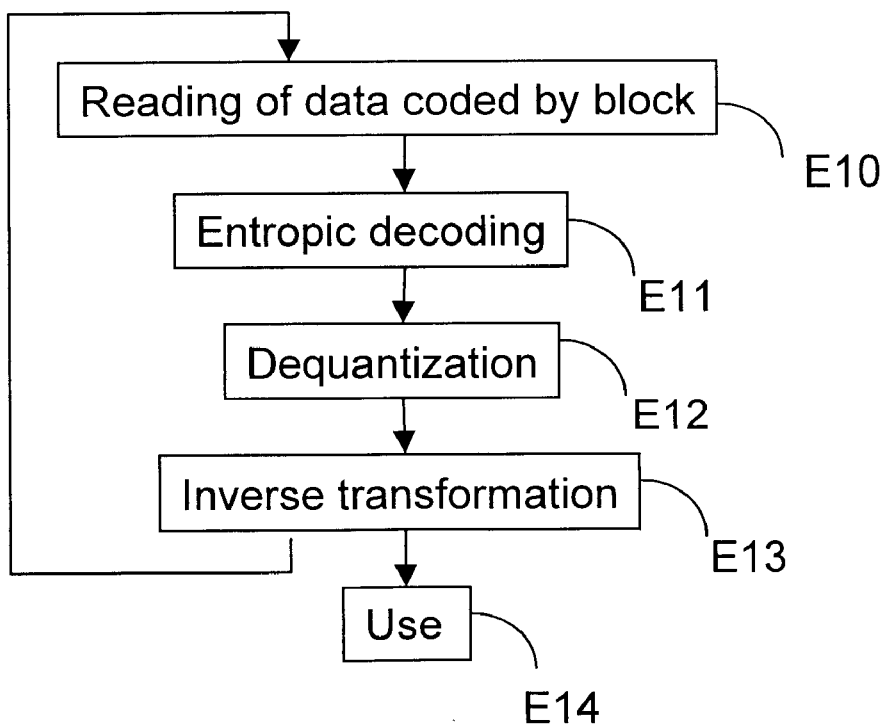

The characteristics and advantages of the present invention will emerge more clearly from a reading of a preferred embodiment illustrated by the accompanying drawings, in which:

FIG. 1 depicts schematically a data processing device according to the invention, FIG. 2 depicts schematically another data processing device according to the invention, FIG. 3 depicts an embodiment of the data processing device according to the invention, FIG. 4 depicts an embodiment of a transformation circuit included in the data processing device of FIG. 1, FIG. 5 is an image to be coded according to the invention, FIG. 6 is a transformed image according to the invention, FIG. 7 is a trellis representing the functioning of a transformation circuit according to the invention, FIG. 8 is a trellis representing the functioning of the transformation circuit which is the inverse of that of FIG. 7, FIG. 9 is a trellis representing the functioning of a transformation circuit according to the invention, FIG. 10 is a trellis representing the functioning of the transformation circuit which is the inverse of that of FIG. 9, FIG. 11 is a trellis representing the functioning of a transformation circuit according to the invention, FIG. 12 is a coding algorithm according to the present invention, FIG. 13 is a decoding algorithm according to the present invention.

According to a chosen embodiment depicted in FIG. 1, a data processing device according to the invention is a data coding device 2 which has an input 24 to which a source 1 of uncoded data is connected.

The source 1 has for example a memory means, such as a random access memory, a hard disk, a diskette or a compact disc, for storing uncoded data, this memory means being associated with a suitable reading means for reading the data therein. A means for recording the data in the memory means can also be provided.

It will more particularly be considered hereinafter that the data to be coded are a series of digital samples representing an image IM.

The source 1 supplies a digital image SI at the input of the coding circuit 2. The image signal SI is a series of digital words, for example bytes. Each byte value represents a pixel of the image IM, here with 256 grey levels, or black and white image. The image can be a multispectral image, for example a colour image having components in three frequency bands, of the red/green/blue or luminance and chrominance type. Each band is then processed in a similar fashion to the monospectral image.

Means 3 using coded data are connected at the output 25 of the coding device 2.

The user means 3 include for example means of storing coded data, and/or means of transmitting coded data.

The coding device 2 has conventionally, as from the input 24, a transformation circuit 21, more particularly relating to the present invention, and several example embodiments of which will be detailed hereinafter. The transformations envisaged here are decompositions of the data signal into frequency sub-band signals, so as to effect an analysis of the signal.

The transformation circuit 21 is connected to a quantization circuit 22. The quantization circuit implements a quantization known per se, for example a scalar quantization or a vector quantization, of the samples, or groups of samples, of the frequency sub-band signals supplied by the circuit 21.

The circuit 22 is connected to an entropic coding circuit 23, which performs an entropic coding, for example a Huffman coding, or an arithmetic coding, of the data quantized by the circuit 22.

FIG. 2 depicts another data processing device according to the invention, in the form of a device 5 for decoding data coded by the device 2.

Means 4 using coded data are connected at the input 54 of the decoding device 5. The means 4 include for example coded data memory means, and/or means of receiving coded data which are adapted to receive the coded data transmitted by the transmission means 3.

Means 6 using decoded data are connected at the output 55 of the decoding device 5. The user means 6 are for example image display means, or sound reproduction means, according to the nature of the data processed.

The decoding device 5 performs overall operations which are the inverse of those of the coding device 2. The device 5 includes an entropic decoding circuit 51, which performs an entropic decoding corresponding to the coding of the circuit 23. The circuit 51 is connected to a dequantization circuit 52, corresponding to the quantization circuit 22. The circuit 52 is connected to an inverse transformation circuit 53, corresponding to the transformation circuit 21. The present invention relates particularly to the inverse transformation circuit 53. Several example embodiments will be detailed hereinafter. The transformations envisaged here effect a synthesis of the digital signal, from frequency sub-band signals.

The coding device and/or the decoding device can be integrated into a digital apparatus, such as a computer, a printer, a facsimile machine, a scanner or a digital photographic apparatus, for example.

The coding device and the decoding device can be integrated into the same digital apparatus, for example a digital photographic apparatus. In this case, the data processing device effects the coding and decoding of the data in a combined fashion, as disclosed hereinafter.

With reference to FIG. 3, an example of a device 10 implementing the invention is described. This device is adapted to transform a digital signal, and, according to the examples developed hereinafter, to analyse it or to synthesis it.

The device 10 is here a microcomputer having a communication bus 101 to which there are connected:

a central unit 100, a read only memory 102, a random access memory 103, a screen 104, a keyboard 114, a hard disk 108, a disk drive 109 adapted to receive a diskette 110, an interface 112 for communication with a communication network 113, an input/output card 106 connected to a microphone 111.

The hard disk 108 stores the programs implementing the invention, which will be described below, as well as the data to be coded and the data coded according to the invention. These programs can also be read on the diskette 110, or received via the communication network 113, or stored in the read only memory 102.

In more general terms, the programs according to the present invention are stored in a storage means. This storage means can be read by a computer or by a microprocessor. This storage means is integrated or not into the device, and can be removable. For example, it can have a magnetic tape, a diskette or a CD-ROM (fixed-memory compact disc).

When the device is powered up, the programs according to the invention are transferred into the random access memory 103, which then contains the executable code of the invention and registers containing the variables necessary for implementing the invention. The random access memory includes a buffer memory.

The device 10 can receive data to be coded from a peripheral device 107, such as a digital photographic apparatus, or a scanner, or any other means of acquiring or storing data.

The device 10 can also receive data to be coded from a distant device, via the communication network 113, and transmit coded data to a distant device, still via the communication network 113.

The device 10 can also receive data to be coded from the microphone 111. These data are then a sound signal.

The screen 104 enables a user notably to display the data to be coded, and serves, with the keyboard 114, as a user interface.

With reference to FIG. 4, the transformation circuit 21, or analysis circuit, is a dyadic decomposition circuit with two levels. The circuit 21 is, in this embodiment, a conventional set of filters, respectively associated with decimators by two, which filter the image signal in two directions, into sub-band signals with high and low spatial frequencies. The relationship between a high-pass filter and a low-pass filter is determined by the conditions for perfect reconstruction of the signal. Different examples of filters will be envisaged hereinafter. It should be noted that the vertical and horizontal decomposition filters are not necessary identical, although in practice this is generally the case. The circuit 21 has here two successive analysis blocks for decomposing the image IM into sub-band signals according to two resolution levels.

In general terms, the resolution of a signal is the number of samples per unit length used for representing this signal. In the case of an image signal, the resolution of a sub-band signal is related to the number of samples per unit length used for representing this sub-band signal horizontally and vertically. The resolution depends on the number of decimations effected, on the decimation factor and on the resolution of the initial image.

The first analysis unit receives the digital image signal SI and applies it to two digital filters, respectively low pass and high pass, 210 and 220, which filter the image signal in a first direction, for example horizontal in the case of an image signal. After passing through decimators by two D210 and D220, the resulting filtered signals are respectively applied to two low pass filters 230 and 250, and high pass filters 240 and 260, which filter then in a second direction, for example vertical in the case of an image signal. Each resulting filtered signal passes through a respective decimator by two D230, D240, D250 and D260. The first unit delivers as an output four sub-band signals $LL_1$, $LH_1$, $HL_1$ and $HH_1$ with the highest resolution $RES_1$ in the decomposition.

The sub-band signal $LL_1$ includes the components, or samples, of low frequency in both directions, of the image signal. The sub-band signal $LH_1$ includes the components of low frequency in a first direction and of high frequency in a second direction, of the image signal. The sub-band signal $HL_1$ includes the components of high frequency in the first direction and the components of low frequency in the second direction. Finally, the sub-band signal $HH_1$ includes the components of high frequency in both directions.

Each sub-band signal is a set of real samples constructed from the original image, which contains information corresponding to a respectively vertical, horizontal and diagonal orientation of the image contours, in a given frequency band. Each sub-band signal can be assimilated to an image.

The sub-band signal $LL_1$ is analysed by an analysis unit similar to the previous one in order to supply four sub-band signals $LL_2$, $LH_2$, $HL_2$ and $HH_2$ of resolution level $RES_2$.

Each of the sub-band signals of resolution $RES_2$ also corresponds to an orientation in the image.

A digital image IM at the output of the image source 1 is represented schematically in FIG. 5, whilst FIG. 6 represents the image IMD resulting from the decomposition of the image IM, into seven sub-bands according to two resolution levels, by the circuit 21. The image IMD includes as much information as the original image IM, but the information is chopped frequentially according to two resolution levels.

Naturally, the number of resolution levels, and consequently of sub-bands, can be chosen differently, for example 10 sub-bands over three resolution levels, or 13 sub-bands over four resolution levels, for a bidimensional signal such as an image. The number of sub-bands per resolution level can also be different. In addition, the decomposition can be non-dyadic. The analysis and synthesis circuits are adapted to the dimension of the processed signal.

In FIG. 6, the samples issuing from the transformation are arranged sub-band by sub-band. However, the image IMD can be represented in an equivalent fashion according to a so-called interlaced mode, in which the samples of the different sub-band signals are grouped together according to their spatial origin in the image. This representation has the advantage that the samples of the transformed image can be calculated in place, that is to say a calculated sample is stored in memory in place of a sample which was used for calculating it. It should be noted that calculation in place is not essential for the present invention.

Hereinafter, interlaced representations will be dealt with. The transformation circuits which make it possible to obtain an interlaced representation are depicted in the form of a trellis.

FIG. 7 is a trellis representing the functioning of a transformation circuit which performs an analysis (dyadic decomposition) of a digital signal according to three resolution levels, in one dimension. The transformation circuit includes two associated filters $H_0$ and $H_1$, respectively low pass and high pass.

A portion of the signal to be transformed, here seventeen samples, has been depicted. It should be noted that each signal sample to be transformed can be a sample or can be a series of samples. According to one example, each sample is a row of a digital image. The filtering effected by trellis is then a vertical filtering of the image. As a variant, in an equivalent fashion, the samples are the columns of the image and the filtering is a horizontal filtering of the image.

The transformation circuit includes two associated filters $H_0$ and $H_1$, respectively low pass and high pass. The filters chosen are 5/3 filters, which can be represented by their samples:

$$H_0 = [-1\ 2\ 6\ 2\ -1]/8$$

$$H_1 = [-1\ 2\ -1]/2$$

According to the so-called "lifting" method of Sweldens, the low-frequency filter $H_0$ can be expressed as a function of the high-frequency filter $H_1$, according to an equation of the type:

$$H_0 = [0\ 0\ 1\ 0\ 0] + \alpha \cdot [1\ 0\ 1] * H_1$$

where $\alpha$ is a multiplying coefficient, equal to 0.25 for a 5/3 filter, and "*" represents the convolution operation. This type of decomposition is said to be reversible.

Accordingly, the low-frequency samples are calculated from the high-frequency samples and samples of the original signal.

Hereinafter:

$x_{2i-1}$, $x_{2i}$, $x_{2i+1}$, ... denote the samples of the signal to be transformed, where i is an integer, $y_{2-1}$, $y_{2i}$, $y_{2i+1}$, ... denote the samples obtained by transformation. The samples with even indices are here the low-frequency samples, and the samples with odd indices are the high-frequency samples.

The index of a sample represents its rank in the ordered series forming the signal.

The calculations performed in the transformation circuit are calculations in place, that is to say a calculated sample, of given rank, is stored in place of another sample with the same rank used for calculating it.

In addition, the samples of the signal to be transformed are processed in an ordered fashion, in increasing rank.

The first row L10 of the trellis includes the samples to be filtered { ..., $x_{2i}$, $x_{2i+1}$, ... }, where the rank of the samples varies in steps of one. These samples are stored in the buffer memory 103 as they become useful for the filtering.

The second row L11 of the trellis includes the high-frequency samples with the first resolution level { ..., $t_{2i-1}$, $t_{2i+1}$, ... }, where the rank of the samples varies in steps of two, obtained by the formula:

$$t_{2i+1} = x_{2i+1} - 0{,}5.(x_{2i} + x_{2i+2}).$$

After it is calculated, the sample $t_{2i+1}$ is stored in the buffer memory, in place of the sample with the same rank in the original signal.

The third row L12 of the trellis includes the low-frequency samples with the first resolution level { ..., $t_{2i-2}$, $t_{2i}$, ... }, where the rank of the samples varies in steps of two, obtained by the formula:

$$t_{2i} = x_{2i} + 0{,}25.(t_{2i+1} + t_{2i-1}).$$

After it is calculated, the sample $t_{2i}$ is stored in the buffer memory, in place of the sample with the same rank in the original signal.

The fourth row L13 of the trellis includes the high-frequency samples with the second resolution level { ..., $v_{2i-2}$, $v_{2i+2}$, ... }, where the rank of the samples varies in steps of four, obtained by the formula:

$$v_{2i-2} = t_{2i-2} - 0{,}5.(t_{2i} + t_{2i-4}).$$

After it is calculated, the sample $v_{2i-2}$ is stored in the buffer memory, in place of the low-frequency sample of the first level with the same rank.

The fifth row L14 of the trellis includes the low-frequency samples of the second resolution level { ..., $v_{2i-4}$, $v_{2i}$, ... }, where the rank of the samples varies in steps of four, obtained by the formula:

$$v_{2i} = t_{2i} + 0{,}25.(v_{2i-2} + v_{2i+2}).$$

After it is calculated, the sample $v_{2i}$ is stored in the buffer memory, in place of the low-frequency sample of the first level with the same rank.

The sixth row L15 of the trellis includes the high-frequency samples of the third resolution level { ..., $y_{2i-4}$, $y_{2i+4}$, ... }, where the rank of the samples varies in steps of eight, obtained by the formula:

$$y_{2i-4} = v_{2i-4} - 0{,}5.(v_{2i} + v_{2i-8}).$$

After it is calculated, the sample $y_{2i-4}$ is stored in the buffer memory, in place of the low-frequency sample of the second level with the same rank.

The seventh row L16 of the trellis includes the low-frequency samples of the third level { ..., $y_{2i-8}$, $y_{2i}$, ... }, where the rank of the samples varies in steps of eight, obtained by the formula:

$$y_{2i} = v_{2i} + 0{,}25.(y_{2i-4} + y_{2i+4}).$$

After it is calculated, the sample $y_{2i}$ is stored in the buffer memory, in place of the low-frequency sample of the second level with the same rank.

The result of the transformation of the original signal { ..., $x_{2i}$, $x_{2i+1}$, ... }, by the 5/3 filters is an interlaced signal. Naturally, it is possible to perform similar operations on a different number of samples, or on a different number of resolution levels, or to use other filters on one or more of the resolution levels.

In practice, only a maximum predetermined number of samples can be stored in memory 103. It is therefore necessary to process the signal by successive blocks of samples.

However, any processing, such as quantization or entropic coding, performed on the signal between its analysis and its synthesis may cause discontinuities during synthesis, because of the processing by block.

In order to avoid these discontinuities on reconstruction of the signal, an overlap is necessary between two adjacent blocks. Two adjacent blocks overlap over a predetermined number of samples.

The present invention concerns particularly the formation of the blocks, and the manner of positioning the limits of the blocks in order to ensure an overlap between the adjacent blocks.

For this purpose, a first limit, referred to as the left-hand limit, is first of all defined. A sample denoted $x_g$ is chosen in the first row L10. From the sample $x_g$, the left-hand limit is formed by passing to the following row L11 following a branch to a sample of rank equal or greater to that of the sample $x_g$. In the example depicted in FIG. 7, there is in fact only one possibility for passing from row L10 to row L11 from the chosen sample $x_g$.

Next, the same rule is applied for passing from one row to the following one, as far as a sample $y_g$ in the last row L16 of the trellis. Thus, passing from a sample in a given row to a sample of equal or greater rank in the following row, a left-hand limit is formed. The left-hand limit is formed by passing successively from a previous sample to a following sample calculated according to the previous sample. It should be noted that the limit using the sample $x_g$ is not unique.

In an equivalent manner, a second limit is defined, referred to as the right-hand limit. A sample denoted $x_d$ is chosen in the first row L10. From the sample $x_d$, the right-hand limit is formed by passing to the following row L11 following a branch to a sample of rank less than or equal to that of the sample $x_d$.

Next, the same rule is applied for passing from one row to the following one, as far as a sample $y_d$ in the last row L16 in the trellis. Thus, by passing from a sample in a given row to a sample of lower or equal rank in the following row, a right-hand limit is formed. The right-hand limit is formed by passing successively from a previous sample to a following sample calculated according to the previous sample. It should be noted that the limit formed from the sample $x_d$ is not unique.

A considered sample, any one in the trellis, can be situated to the left or respectively to the right of a limit, whether it be right or left, if its rank is below, or respectively greater than, the rank of the sample belonging to the limit and to the same row as the sample under consideration.

In addition, any sample will be said to be strictly to the left or respective strictly to the right of a limit if its rank is strictly below, or respectively strictly greater than, the rank of the sample belonging to the limit and to the same row as the sample under consideration.

Said any sample will be said to be left or respectively right in the broad meaning of a limit if its rank is less than or equal, or respectively greater than or equal, to the rank of the sample belonging to the limit and to the same row as the sample under consideration.

In addition, a left-hand limit and a right-hand limit are said to be compatible when no sample in the trellis is situated both strictly to the left of the left-hand limit and strictly to the right of the right-hand limit, that is to say, in other words, when there is no compatibility sample having a rank strictly lower than the rank of the sample belonging to the start limit of the first following input block and to the same row as the compatibility sample, and at the same time a rank strictly greater than the rank of the sample belonging to the end limit of the first input block considered and to the same row as the compatibility sample.

The right-hand limit determines the end of the first input block BE1. In this block, the samples as far as the right-hand limit inclusive are used for making the calculations, the following samples being "unknown". The branches which connect unknown samples to samples belonging to the block BE1, which are consequently to be calculated, are eliminated. The eliminated branches, three in number in the example depicted, are in dotted lines.

In an equivalent manner, the left-hand limit determines the start of a second input block BE2. In this block, the samples as from the left-hand limit inclusive are used for making the calculations, the previous samples being "unknown". The branches which connect unknown samples to samples belonging to block BE2, which are consequently to be calculated, are eliminated. The eliminated branches, three in number in the example depicted, are in dotted lines.

The left-hand and right-hand limits are compatible, within the meaning defined above.

As disclosed below, the calculations are adapted as a consequence of the elimination of branches.

The input blocks BE1 and BE2 thus overlap between samples $x_g$ and $x_d$.

The output blocks BS1 and BS2 corresponding respectively to the input blocks BE1 and BE2 are formed with the same overlap between blocks, here between the output samples having the same ranks as the input samples $x_g$ and $x_d$.

The output samples which are situated in two consecutive output blocks are quantized and then coded entropically in each of the two output blocks. Thus the data blocks can be coded and decoded independently of each other.

FIG. 8 is a trellis representing the functioning of the inverse transformation circuit, or synthesis circuit, corresponding to the trellis of FIG. 7. The samples to be filtered are here the interlaced high and low frequency samples obtained after analysis filtering of a digital image. These samples have possibly been modified by another processing between analysis and synthesis.

The first row L20 of the trellis includes the low-frequency samples of the third resolution level $\{ \ldots, y_{2i-8}, y_{2i}, \ldots \}$, where the rank of the samples varies in steps of eight and the high-frequency samples of the third resolution level $\{ \ldots, y_{2i-4}, y_{2i+4}, \ldots \}$, where the rank of the samples varies in steps of eight.

The second row L21 of the trellis includes the samples of even rank $\{ \ldots, v_{2i-8}, v_{2i}, \ldots \}$, where the rank of the samples varies in steps of eight, of the reconstructed low-frequency signal, of the second resolution level, obtained by the formula:

$$v_{2i} = y_{2i} - 0,25.(y_{2i-4} + y_{2i+4}).$$

After it is calculated, the sample $v_{2i}$ is stored in the buffer memory, in place of the sample $y_{2i}$ with the same rank.

The third row L22 of the trellis includes the high-frequency samples of the second resolution level $\{ \ldots, v_{2i-2}, v_{2i+2}, \ldots \}$, where the rank of the samples varies in steps of four, and the samples of odd rank $\{ \ldots, v_{2i-4}, v_{2i+4}, \ldots \}$, where the rank of the samples varies in steps of eight, of the reconstructed low-frequency signal, of the second resolution level, obtained by the formula:

$$v_{2i-4} = y_{2i-4} + 0,5.(v_{2i-8} + v_{2i}).$$

After it is calculated, the sample $v_{2i-4}$ is stored in the buffer memory, in place of the sample $y_{2i-4}$ with the same rank.

The fourth row L23 of the trellis includes the samples of even rank $\{ \ldots, t_{2i-4}, t_{2i}, \ldots \}$, where the rank of the samples varies in steps of four, of the reconstructed low-frequency signal, of the first resolution level, obtained by the formula:

$$t_{2i} = v_{2i} - 0,25.(v_{2i-2} + v_{2i+2}).$$

After it is calculated, the sample $t_{2i}$ is stored in the buffer memory, in place of the sample $v_{2i}$ with the same rank.

The fifth row L24 of the trellis includes the high-frequency samples of the first level $\{ \ldots, t_{2i-1}, t_{2i+1}, \ldots \}$, where the rank of the samples varied in steps of two, and the samples of odd rank $\{ \ldots, t_{2i-2}, t_{2i+2}, \ldots \}$, where the rank of the samples varies in steps of four, of the reconstructed low-frequency signal, of the first resolution level, obtained by the formula:

$$t_{2i-2} = v_{2i-2} + 0,5.(t_{2i-4} + t_{2i}).$$

After it is calculated, the sample $t_{2i-2}$ is stored in the buffer memory, in place of the sample $v_{2i-2}$ with the same rank.

The sixth row L25 of the trellis includes the samples of even rank $\{ \ldots, x_{2i}, x_{2i+2}, \ldots \}$ of the reconstructed signal obtained by the formula:

$$x_{2i} = t_{2i} - 0,25.(t_{2i-1} + t_{2i+1}).$$

After it is calculated, the sample $x_{2i}$ is stored in the buffer memory, in place of the sample $t_{2i}$ of the same rank.

The seventh row L26 of the trellis includes the samples of odd rank $\{ \ldots, x_{2i-1}, x_{2i+1}, \ldots \}$ of the reconstructed signal obtained by the formula:

$$x_{2i+1} = t_{2i+1} + 0,5.(x_{2i} + x_{2i+2}).$$

After it is calculated, the sample $x_{2i+1}$ is stored in the buffer memory, in place of the sample $t_{2i+1}$ of the same rank.

As before, the signal is processed by blocks of samples. The same considerations concerning the ends of the block and the block overlaps apply.

In addition, the boundaries at the start and ends of blocks are placed in a manner corresponding to the analysis, in order to ensure, in the case of reversible decompositions, the perfect reconstruction of the signal in the absence of processing between analysis and synthesis. Thus the eliminated branches correspond to the branches eliminated on analysis and, in other words, the calculations are adapted in a manner corresponding to analysis.

An input block BE3 ends after the sample $v_{2i+2}$, a following input block BE4 commences from the sample $t_{2i-9}$. The input blocks BE3 and BE4 overlap between the samples of rank 2i−9 and 2i+2.

Output blocks BS3 and BS4 are formed. The output blocks BS3 and BS4 are adjacent, their boundary, here between the samples $t_{2i-5}$ and $y_{2i-4}$ being able to be placed indifferently between any two samples throughout the overlap part, or just before the output sample of the same rank as the input sample $x_g$, just after the output sample with the same rank as the input sample $x_d$.

Branches are eliminated, and consequently the calculations of certain samples are modified, in a manner corresponding to the analysis.

FIGS. 9 and 10 are trellises identical respectively to those of FIGS. 7 and 8, except that the blocks overlap on only one sample, which constitutes the smallest overlap and consequently minimises the memory occupation. This case is applicable for odd filters.

In FIG. 9, the left and right paths are merged, and are formed from the same sample $x_g = x_d$. Consequently, the left and right paths contain only samples of the same rank.

The input blocks BE5 and BE6 are formed, and overlap solely on the input sample $x_g = x_d$.

The input sample $x_g = x_d$ has the same rank as a calculated sample which is a low-frequency sample. In addition, this calculated sample is here an output sample, that is to say a low-frequency sample of the lowest resolution level.

When the input block BE5 is processed, three branches are eliminated and the calculations are adapted accordingly.

Likewise, when the input block BE6 is processed, three branches are eliminated and the calculations are adapted accordingly.

Output blocks BS5 and BS6 are also formed, and overlap solely on the output sample with the same rank as the input sample $x_g = x_d$.

The overlap on a single output sample, and more particularly if this sample is a low-frequency sample of the lowest resolution level, as depicted in FIG. 9, greatly reduces the discontinuity effects due to processing by blocks.

As before, the output blocks BS5 and BS6 are quantized and then coded entropically, the overlap sample being processed in each of the blocks.

FIG. 10 is a trellis representing the functioning of the inverse transformation circuit, or synthesis circuit corresponding to the trellis of FIG. 9.

Thus two input blocks BE7 and BE8 overlap on an input sample.

Calculation branches are eliminated, and the calculations adapted, in the manner corresponding to the analysis.

Adjacent output blocks BS5 and BS6 are also formed. The boundary between the output blocks BS5 and BS6 is situated just before the output samples with the same rank as the input sample $x_g = x_d$. In an equivalent fashion, the boundary could be just after this sample.

Details will now be given on the way in which the calculations are adapted when a calculation branch is eliminated. The concern is consequently with the weighting coefficients associated with the branches.

FIG. 11 is a trellis representing the functioning of another transformation circuit which effects an analysis of a digital signal according to two dyadic decomposition levels, in one dimension. The transformation circuit has two associated filters $H_0$ and $H_1$, respectively low pass and high pass.

The input samples are processed in an ordered fashion, in increasing rank.

According to the embodiment chosen, the chosen filters are 9/7 filters, for example those disclosed in the article "Ten lectures on wavelets", by Ingrid DAUBECHIES, CBMS-NSF Regional Conference Series in Applied Mathematics Vol. 61 SIAM, Journal of Mathematics Anal. Philadelphia Pa. 1992.

By performing calculations similar to those previously presented, the following relationships are obtained between the samples of the trellis.

The first row L30 of the trellis includes the samples to be filtered $\{ \ldots, x_{2i}, x_{2i+1}, \ldots \}$, where the step of the samples varies in steps of one. These samples are stored in a buffer memory 103 as they become useful for filtering.

Hereinafter, $a_1$, $b_1$, $a_2$, $b_2$, $a_3$, $b_3$, $a_4$ and $b_4$ are real coefficients, whose values are given by way of example. In all cases, the coefficients $b_1$, $b_2$ and $b_3$ are non-nil.

The second row L31 of the trellis is a first stage for the first decomposition level and includes intermediate samples $\{ \ldots, t_{2i-1}, t_{2i+1}, \ldots \}$, where the step of the samples varies in steps of two, obtained by means of the formula: $t_{2i+1} = b_1 \cdot x_{2i+1} + a_1 \cdot (x_{2i} + x_{2i+2})$, that is to say, in a particular case:

$$t_{2i+1} = x_{2i+1} - 1{,}586134 \cdot (x_{2i} + x_{2i+2}).$$

After it is calculated, the sample $t_{2i+1}$ is stored in the buffer memory, in place of the sample of the same rank in the original signal.

The third row L32 of the trellis is a second stage for the first decomposition level and includes intermediate samples $\{ \ldots, v_{2i}, v_{2i+2}, \ldots \}$, where the step of the samples varies in steps of two, obtained by means of the formula:

$$v_{2i} = b_2 \cdot x_{2i} + a_2 \cdot (t_{2i+1} + t_{2i-1}), \text{ that is to say}$$

$$v_{2i} = x_{2i} - 0{,}052980 \cdot (t_{2i+1} + t_{2i-1}).$$

After it is calculated, the sample $v_{2i}$ is stored in the buffer memory, in place of the sample with the same rank in the original signal.

The fourth row L33 of the trellis is a third stage for the first decomposition level and includes the high-frequency samples of the first level $\{ \ldots, y_{2i-1}, v_{2i+1}, \ldots \}$, where the step of the samples varies in steps of two, obtained by means of the formula:

$$y_{2i+1} = b_3 \cdot t_{2i+1} + a_3 \cdot (v_{2i} + v_{2i+2}), \text{ that is to say}$$

$$y_{2i+1} = t_{2i+1} + 0{,}882911 \cdot (v_{2i} + v_{2i+2}).$$

After it is calculated, the sample $y_{2i+1}$ is stored in the buffer memory, in place of the intermediate sample of the same rank.

The fifth row L34 of the trellis is a fourth stage for the first decomposition level and includes the low-frequency samples of the first level $\{ \ldots, y_{2i}, v_{2i+2}, \ldots \}$, where the step of the samples varies in steps of two, obtained by means of the formula:

$$y_{2i} = b_4 \cdot v_{2i} + a_4 \cdot (y_{2i+1} + y_{2i-1}), \text{ that is to say}$$

$$y_{2i} = v_{2i} + 0{,}443507 \cdot (y_{2i+1} + y_{2i-1}).$$

After it is calculated, the sample $y_{2i}$ is stored in the buffer memory, in place of the intermediate sample with the same rank.

The samples $y_{2i}$ and $y_{2i+1}$ are then normalized. In order to simplify the notations, the normalized samples are referenced $y_{2i}$ and $y_{2i+1}$. These normalization formulae are:

$$y_{2i} = y_{2i} / K_0$$

$$y_{2i+1} = y_{2i+1} \cdot K_1$$

where $K_0$ and $K_1$ are normalization factors equal to 0.869865 for these 9/7 filters.

After they are calculated, these samples are stored in the buffer memory 103 in place of the initial samples $y_{2i}$ and $y_{2i+1}$.

The samples used for the second decomposition level are now the normalized samples.

The sixth row L35 of the trellis is a first stage for the second decomposition level and includes intermediate samples $\{\ldots, t^1_{2i}, t^1_{2i+4}, \ldots\}$, where the step of the samples varies in steps of four, obtained by means of the formula:

$$t^1_{2i} = b_1 \cdot y_{2i} + a_1 \cdot (y_{2i-2} + y_{2i+2}), \text{ that is to say}$$

$$t^1_{2i} = y_{2i} - 1{,}586134 \cdot (y_{2i-2} + y_{2i+2}).$$

After it is calculated, the sample $t^1_{2i}$ is stored in the buffer memory, in place of the sample $y_{2i}$ of the same rank.

The seventh row L36 of the trellis is a second stage for the second decomposition level and includes immediate samples $\{\ldots, v^1_{2i-2}, v^1_{2i+2}, \ldots\}$, where the step of the samples varies in steps of four, obtained by means of the formula:

$$v^1_{2i+2} = b_2 \cdot y_{2i+2} + a_2 \cdot (t^1_{2i} + t^1_{2i+4}), \text{ that is to say}$$

$$v^1_{2i+2} = y_{2i+2} - 0{,}052980 \cdot (t^1_{2i} + t^1_{2i+4}).$$

After it is calculated, the sample $v^1_{2i+2}$ is stored in the buffer memory, in place of the sample $y_{2i+2}$ with the same rank.

The eighth row L37 of the trellis is a third stage for the second decomposition level and includes the high-frequency samples of the second level $\{\ldots, y^1_{2i}, y^1_{2i+4}, \ldots\}$, where the step of the samples varies in steps of four, obtained by means of the formula:

$$y^1_{2i} = b_3 \cdot t^1_{2i} + a_3 \cdot (v^1_{2i-2} + v^1_{2i+2}), \text{ that is to say}$$

$$y^1_{2i} = t^1_{2i} + 0{,}882911 \cdot (v^1_{2i-2} + v^1_{2i+2}).$$

After it is calculated, the sample $y^1_{2i}$ is stored in the buffer memory, in place of the intermediate sample with the same rank.

The ninth row L38 of the trellis is a fourth stage for the second decomposition level and includes the low-frequency samples of the second level $\{\ldots, y^1_{2i-2}, y^1_{2i+2}, \ldots\}$, where the step of the samples varies in steps of four, obtained by means of the formula:

$$y^1_{2i+2} = b_4 \cdot v^1_{2i+2} + a_4 \cdot (y^1_{2i} + y^1_{2i+4}), \text{ that is to say}$$

$$y^1_{2i+2} = v^1_{2i+2} + 0{,}443507 \cdot (y^1_{2i} + y^1_{2i+4}).$$

After it is calculated, the sample $y^1_{2i+2}$ is stored in the buffer memory, in place of the intermediate sample of the same rank.

The samples $y^1_{2i}$ and $y^1_{2i+2}$ are then normalized. In order to simplify the notations, the normalized samples are referenced $y^1_{2i}$ and $y^1_{2i+2}$. The normalization formulae are:

$$y^1_{2i} = y^1_{2i} \cdot K_1$$

$$y^1_{2i+2} = y^1_{2i+2} / K_0$$

where $K_0$ and $K_1$ are equal to 0.869865.

After they are calculated, these samples are stored in a buffer memory 103 in place of the initial samples $y^1_{2i}$ and $y^1_{2i+2}$.

The result of the transformation, here a dyadic decomposition with two levels, of the original signal $\{\ldots, x_{2i}, x_{2i+1},\}$ by the 9/7 filters is an interlaced signal of the form: $\{\ldots, y^1_{2i-2}, y_{2i-1}, y^1_{2i}, y_{2i+1}, y^1_{2i+2}, \ldots\}$, that is to say having a succession of samples which are low frequency of the second level, high frequency of the first level, high frequency of the second level, high frequency of the first level, and so on.

As before, input and output blocks are formed and branches are eliminated for the calculations of certain samples.

Here central branch means a branch connecting two samples with the same rank and belonging to two different rows, and non-central branch means a branch connecting two samples of different ranks and belonging to different rows.

It should be noted that the eliminated branches are not central.

In order to preserve the normalization properties of the reversible decompositions, the elimination of a branch gives rise to the modification of the coefficient of at least one other branch.

The modification relating to the elimination of the branch is effected on the central branch resulting in the same sample as the eliminated branch.

For example, in FIG. 11, the calculation of the sample $z_4 = y^1_{2i+2}$ is modified in order to take account of the elimination of the branches coming from the samples $z_1 = y^1_{2i}$ and $z_3 = y^1_{2i+4}$.

A total weight P is defined for a sample considered as the value that this sample would have if all the samples of the previous low sub-band all equalled one. The previous low sub-band can be the original signal. For the samples $z_1$, $z_2 = v^1_{2i+2}$ and $z_3$, the previous low sub-band is on row L34.

Thus for example:

$$P(z_1) = b_3 \cdot (b_1 + 2 \cdot a_1) + 2 \cdot a_3 \cdot (b_2 + 2 \cdot a_2 \cdot (b_1 + 2 \cdot a_1))$$

$$P(z_2) = b_2 + 2 \cdot a_2 \cdot (b_1 + 2 \cdot a_1)$$

$$P(z_3) = b_3 \cdot (b_1 + 2 \cdot a_1) + 2 \cdot a_3 \cdot (b_2 + 2 \cdot a_2 \cdot (b_1 + 2 \cdot a_1))$$

When a non-central branch is eliminated, the weighting coefficient of the central branch resulting in the same sample is modified by adding to it the product of the total weight of the sample from which the eliminated branch issued with the weighting coefficient of this eliminated branch, this product also being divided by the weight of the sample from which the central branch issued.

Thus, in order to take account of the elimination of the two branches coming from the samples $z_1$ and $z_3$, the modified weighting coefficient $b'_4$ of the branch leading to the sample $y^1_{2i+2}$ is equal to:

$$b_4 + a_4 \cdot P(z_1) / P(z_2) + a_4 \cdot P(z_3) / P(z_2).$$

It should be noted that, for the other eliminated non-central branches, the weighting coefficient of each eliminated branch has been added respectively to the non-central branch leading to the same sample. Thus, for example, $$t_{2i-1} = b_1 \cdot x_{2i-1} + 2 \cdot a_1 \cdot x_{2i}.$$

As a variant, the weights of an eliminated branch can be transferred partly to the central branch and partly to a non-central branch.

The weighting coefficients of the corresponding synthesis filter are modified in the same way.

FIG. 12 depicts a digital signal coding algorithm according to the present invention.

This algorithm, implemented in the coding device, includes steps E1 to E5.

The coding algorithm can be stored in whole or in part in any information storage means capable of cooperating with the microprocessor. This storage means can be read by a computer or by a microprocessor. This storage means is integrated or not into the device, and can be removable. For example, it can include a magnetic tape, a diskette or a CD-ROM (fixed-memory compact disc).

Step E1 is the reading of a series of samples, here an input block, of the signal to be coded.

The following step E2 is the transformation of the series of samples read. This transformation is for example an analysis filtering resulting in an output block, as previously described.

Step E2 is followed by step E3, at which the series of filtered samples is quantized. Preferably, the same quantization, with the same parameters, is used in two consecutive blocks, at least on the overlap part. For example, the quantization is a scalar quantization, the same quantization step being used in two consecutive blocks, at least on the overlap part.

The following step E4 is the entropic coding of the previously quantized data.

Steps E1 to E4 are repeated for all the series of samples of the signal to be coded.

Step E4 is followed by step E5, which is the use of the coded data, for example the transmission thereof. It should be noted that the series of coded samples can be transmitted as they are formed, or when all the series of the signal have been coded.

FIG. 13 depicts a digital signal decoding algorithm according to the present invention.

This algorithm, implemented in the decoding device, includes steps E10 to E14.

The decoding algorithm can be stored in whole or in part in any information storage means capable of cooperating with the microprocessor. This storage means can be read by a computer or by a microprocessor. This storage means is integrated or not into the device, and can be removable. For example, it can include a magnetic tape, a diskette or a CD-ROM (fixed-memory compact disc).

Step E10 is the reading of a series of samples to be decoded.

The following step E11 is an entropic decoding of the previously read data.

The following step E12 is a dequantization of the data decoded at the previous step.

The dequantized data then undergo a transformation which is the inverse of step E11, for example a synthesis filtering, as previously described.

Steps E10 to E13 are repeated for all the series of samples to be decoded.

Step E13 is followed by step E14 of using the decoded data, for example displaying them, in the case of an image signal.

Naturally, the present invention is in no way limited to the embodiments described and depicted, but quite the contrary encompasses any variant within the capability of a person skilled in the art.

Notably, the invention is not limited to the field of digital signal coding, but applies to all fields of signal processing, when it is sought to minimise the distortions of a signal which is transformed and then reconstructed.

What is claimed is:

1. Method for the analysis filtering of an original digital signal including original samples representing physical quantities, original samples of the digital signal being transformed by successive calculation steps into high and low frequency output samples, any sample calculated at a given step being calculated by a predetermined function of original samples, and/or previously calculated samples, the samples being ordered by increasing rank, characterized in that:

the signal is processed by successive input blocks of samples (BE1, BE2), the calculations made on an input block under consideration taking into account only the original or calculated samples belonging to the input block under consideration, the input block under consideration (BE1) and the following input block (BE2) overlap over a predetermined number of original samples, the start limit of the input block under consideration is formed between a first original sample and a first output sample, passing successively, from a previous sample to a following sample calculated as a function of the previous sample, the following sample having a rank equal to or greater than the previous sample, the end limit of the input block under consideration is formed between a second original sample and a second output sample, passing successively from a previous sample to a following sample, calculated as a function of the previous sample, the following sample having a rank equal to or less than the previous sample, the end limit of the input block under consideration and the start limit of the following input block are such that there does not exist any compatibility sample having a rank strictly less than the rank of the sample belonging to the start image of the following input block and to the same row as the compatibility sample, and at the same time a rank strictly greater than the rank of the sample belonging to the end limit of the input block under consideration and to the same row as the compatibility sample, output blocks (BS1, BS2) are formed, each output block corresponding respectively to an input block, two consecutive output blocks overlap over output samples having the same ranks as the original samples on which the input blocks corresponding to the output blocks under consideration overlap.

2. Analysis filtering method according to claim 1, characterized in that two consecutive output blocks (BS5, BS6) overlap over a single output sample.

3. Analysis filtering method according to claim 1, characterized in that two consecutive output blocks overlap over a single output sample which is a low-frequency output sample.

4. Method of coding a digital signal including original samples representing physical quantities, the coding including:

an analysis filtering, (E2) effected according to the method according to claim 1, in order to form filtered samples, a quantization (E3) of the previously filtered samples, and an entropic coding (E4) of the previously quantized samples.

5. Coding method according to claim 4, characterized in that the same quantization, with the same parameters, is used for two successive blocks, at least for the samples situated in the overlap part of two blocks under consideration.

6. Coding method according to claim 4, characterized in that the quantization is a scalar quantization and in that the same scalar quantization, with the same quantization step, is used for two successive blocks, at least for the samples situated in the overlap part of the two blocks under consideration.

7. Method according to claim 1, characterized in that the original digital signal is an image signal (IM) and in that the original samples are rows of the image.

8. Method according to claim 1, characterized in that the original digital signal is an image signal (IM) and in that the original samples are columns of the image.

9. Device for the analysis filtering of an original digital signal including original samples representing physical quantities, the device having means of transforming the original samples of the digital signal into high and low frequency output samples, by successive calculation steps, any sample calculated at a given step being calculated by a predetermined function of original samples, and/or are previously calculated samples, the samples being ordered by increasing rank, characterized in that:

the signal transformation means are adapted to process by successive sample input blocks (BE1, BE2), the processing means being adapted to effect the calculations on an input block under consideration taking into account only the original or calculated samples belonging to the input block under consideration, the signal transformation means are adapted to form the input block under consideration (BE1) and the following input block (BE2) so that they overlap over a predetermined number of original samples, the signal transformation means are adapted to form the start limit of the input block under consideration between a first original sample and an output sample, passing successively from a previous sample to a following sample calculated as a function of the previous sample, the following sample having a rank equal to or greater than the previous sample, the signal transformation means are adapted to form the end limit of the input block under consideration between a second original sample and a second output sample, passing successively from a previous sample to a following sample calculated as a function of the previous sample, the following sample having a rank equal to or less than the previous sample, the signal transformation means are adapted to form the end limit of the input block under consideration and the start limit of the following input block so that there exists no compatibility sample having a rank strictly less than the rank of the sample belonging to the start limit of the following input block and to the same row as the compatibility sample, and at the same time a rank strictly greater than the rank of the sample belonging to the end limit of the input block under consideration and to the same row of the compatibility sample, the signal transformation means are adapted to form output blocks (BS1, BS2), each output block corresponding respectively to an input block, the signal transformation means are adapted to form the output blocks so that two consecutive output blocks overlap over output samples having the same ranks as the original samples over which the input blocks corresponding to the output blocks under consideration overlap.

10. Analysis filtering device according to claim 9, characterized in that the signal transformation means are adapted to form the output blocks so that two consecutive output blocks (BS5, BS6) overlap over a single output sample.

11. Analysis filtering device according to claim 9, characterized in that the signal transformation means are adapted to form the output blocks so that two consecutive output blocks overlap over a single output sample which is a low-frequency output sample.

12. Device for coding a digital signal including original samples representing physical quantities, the coding device having:

analysis filtering means (21) in accordance with the device according to claim 9, for forming filtered samples, means (E3) of quantization of the previously filtered samples, and means for the entropic coding (E4) of the previously quantized samples.

13. Coding device according to claim 12, characterised in that the same quantization means, with the same parameters, are used for two successive blocks, at least for the samples situated in the overlap part of the two blocks under consideration.

14. Coding device according to claim 12, characterised in that the quantization means use a scalar quantization and in that the same scalar quantization, with the same quantization step, is used for two successive blocks, at least for the samples situated in the overlap part of the two blocks under consideration.

15. Device according to claim 9, characterized in that it is adapted to process an original digital signal which is an image signal (IM) and in that the original samples are rows of the image.

16. Device according to claim 9, characterized in that it is adapted to process an original digital signal which is an image signal (IM) and in that the original samples are columns of the image.

17. Device according to claim 9, characterized in that the transformation means are incorporated in:

a microprocessor (100), a read only memory (102) containing a program for filtering the signal, and a random access memory (103) containing registers adapted to record variables modified during the running of said program.

18. Device according to claim 12, characterized in that the filtering means are incorporated in:

a microprocessor (100), a read only memory (102) containing a program for filtering the signal, and a random access memory (103) containing registers adapted to record variables modified during the running of said program.

* * * * *